United States Patent
Kang

(10) Patent No.: US 9,548,343 B2
(45) Date of Patent: Jan. 17, 2017

(54) FLEXIBLE DISPLAY

(71) Applicant: Samsung Display Co., Ltd., Yongin-si, Gyeonggi-do (KR)

(72) Inventor: Jin Gyu Kang, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/072,658

(22) Filed: Mar. 17, 2016

(65) Prior Publication Data

US 2016/0197129 A1 Jul. 7, 2016

Related U.S. Application Data

(62) Division of application No. 14/461,657, filed on Aug. 18, 2014, now Pat. No. 9,305,984.

(30) Foreign Application Priority Data

Nov. 6, 2013 (KR) .......................... 10-2013-0134331

(51) Int. Cl.
*H01L 27/32* (2006.01)
*H01L 51/00* (2006.01)
(Continued)

(52) U.S. Cl.
CPC ....... *H01L 27/3248* (2013.01); *H01L 27/1259* (2013.01); *H01L 27/3244* (2013.01);
(Continued)

(58) Field of Classification Search
None
See application file for complete search history.

(56) References Cited

U.S. PATENT DOCUMENTS

2003/0034497 A1 2/2003 Yamazaki et al.
2007/0087492 A1 4/2007 Yamanaka
(Continued)

FOREIGN PATENT DOCUMENTS

KR          10 0611219     8/2006
KR   10 2007 0037070     4/2007
(Continued)

OTHER PUBLICATIONS

European Search Report dated Apr. 20, 2015 in European Patent Application No. 14190490.4.

*Primary Examiner* — Khaja Ahmad
(74) *Attorney, Agent, or Firm* — Knobbe Martens Olson & Bear LLP

(57) ABSTRACT

A flexible display includes: a first flexible substrate; an intermediate barrier layer positioned on the first flexible substrate and comprising silicon oxide; an adhesive layer positioned on the intermediate barrier layer and comprising at least one of amorphous silicon on which a P-type or N-type conductive impurity is doped, or hydrogenated amorphous silicon; a second flexible substrate positioned on the adhesive layer; a first barrier layer positioned on the second flexible substrate and comprising silicon oxide; a second barrier layer positioned on the first barrier layer and comprising silicon nitride; a buffer layer positioned on the second barrier layer and comprising silicon oxide; a thin film transistor positioned on the buffer layer; and an organic light emitting element connected to the thin film transistor.

10 Claims, 8 Drawing Sheets

(51) Int. Cl.
*H01L 27/12* (2006.01)
*H01L 51/52* (2006.01)

(52) U.S. Cl.
CPC ...... *H01L 27/3251* (2013.01); *H01L 51/0097* (2013.01); *H01L 51/5253* (2013.01); H01L 2227/323 (2013.01); H01L 2251/5338 (2013.01); H01L 2251/558 (2013.01); Y02E 10/549 (2013.01); Y02P 70/521 (2015.11)

(56) References Cited

U.S. PATENT DOCUMENTS

| | | | |
|---|---|---|---|
| 2007/0108472 A1* | 5/2007 | Jeong | H01L 29/66757 257/192 |
| 2008/0272375 A1* | 11/2008 | Oh | G02F 1/13471 257/72 |
| 2009/0068817 A1 | 3/2009 | Eun | |
| 2011/0139747 A1 | 6/2011 | Lee | |
| 2011/0193067 A1* | 8/2011 | Lee | H01L 51/5256 257/40 |
| 2013/0140547 A1 | 6/2013 | Lee et al. | |

FOREIGN PATENT DOCUMENTS

| | | |
|---|---|---|
| WO | WO 00/36665 | 6/2000 |
| WO | WO 00/65670 | 11/2000 |

* cited by examiner

FLEXIBLE DISPLAY

CROSS-REFERENCE TO RELATED APPLICATIONS

This application is a divisional of U.S. patent application Ser. No. 14/461,657, filed Aug. 18, 2014, which claims priority to, and the benefit of, Korean Patent Application No. 10-2013-0134331 filed in the Korean Intellectual Property Office on Nov. 6, 2013, the entire contents of which are incorporated herein by reference.

BACKGROUND

Field

The present disclosure relates to a flexible display and a manufacturing method thereof.

Description of the Related Technology

A thin film transistor (TFT) has been used in various fields, including as a switching and driving element in a flat display device such as a liquid crystal display (LCD), an organic light emitting diode (OLED) display, and an electrophoretic display.

The thin film transistor typically includes a gate electrode connected to a gate line transferring a scan signal, a source electrode connected to a data line transferring a signal to be applied to a pixel electrode, a drain electrode facing the source electrode, and a semiconductor electrically connected to the source electrode and the drain electrode.

A semiconductor of the thin film transistor is generally formed of amorphous silicon or crystalline silicon. The amorphous silicon may be deposited at a low temperature to form a thin film, thereby being widely used in a display device mainly using glass having a low melting point as a substrate, and the crystalline silicon has electrical characteristics of high field effect mobility, a high frequency operation characteristic, and a low leakage current.

In order to form the thin film transistor on the substrate, a buffer layer for preventing an impurity and the like from entering the thin film transistor is typically required.

However, in a case where the buffer layer contains a large amount of hydrogen, failure of the thin film transistor due to, for example, a film tearing phenomenon, is generated during a process for crystallizing the semiconductor of the thin film transistor.

Further, hydrogen exhibits different hydrogen passivation effects according to a position of the substrate, to cause a non-uniform element characteristic.

Additionally, in a case where a flexible display is manufactured like the organic light emitting diode display, the buffer layer may be separated from the substrate by repeated bending due to a characteristic of the flexible display.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

The present disclosure has been made in an effort to provide a flexible display in which failure of a thin film transistor due to hydrogen is not generated, and a manufacturing method thereof.

Further, the present disclosure has been made in an effort to provide a flexible display in which a thin film is not separated even if the flexible display is repeatedly bent, and a manufacturing method thereof.

One embodiment provides a method of manufacturing a flexible display, including: forming a first barrier layer on a flexible substrate; forming a second barrier layer including silicon nitride on the first barrier layer; releasing stress of the second barrier layer; forming a first buffer layer including silicon nitride on the second barrier layer; forming a second buffer layer on the first buffer layer; and forming a thin film transistor on the second buffer layer.

Releasing stress may include exposing the second barrier layer to air.

The flexible substrate may include at least one polymer material layer including polyimide.

The flexible substrate may include: a first flexible substrate; an intermediate barrier layer formed on the first flexible substrate; and a second flexible substrate formed on the intermediate barrier layer, wherein the intermediate barrier layer may include a same material as the first barrier layer.

The method may further include forming an adhesive layer between the first flexible substrate and the second flexible substrate, and the adhesive layer may include at least one of amorphous silicon on which a P-type or N-type conductive impurity is doped, or hydrogenated amorphous silicon.

The intermediate barrier layer may be formed to have a thickness of about 1000 Å to about 6000 Å.

The first flexible substrate and the second flexible substrate may include a polyimide.

Each of the first flexible substrate and the second flexible substrate may be formed to have a thickness of about 8 μm to about 12 μm.

Another embodiment provides a flexible display including: a first flexible substrate; an intermediate barrier layer positioned on the first flexible substrate and including a silicon oxide; an adhesive layer positioned on the intermediate barrier layer and including at least one of amorphous silicon on which a P-type or N-type conductive impurity is doped, or hydrogenated amorphous silicon; a second flexible substrate positioned on the adhesive layer; a first barrier layer positioned on the second flexible substrate and including silicon oxide; a second barrier layer positioned on the first barrier layer and including silicon nitride; a buffer layer positioned on the second barrier layer and including silicon oxide; a thin film transistor positioned on the buffer layer; and an organic light emitting element connected to the thin film transistor.

The first flexible substrate and the second flexible substrate may include a polyimide.

Each of the first flexible substrate and the second flexible substrate may be formed to have a thickness of about 8 μm to about 12 μm.

A thickness of the intermediate barrier layer may be from about 1000 Å to about 6000 Å.

The buffer layer may include a first buffer sub-layer positioned on the second barrier layer and a second buffer sub-layer positioned on the first buffer sub-layer, and the first buffer sub-layer may include a silicon nitride.

A thickness of the first barrier layer may be from about 1000 Å to about 6000 Å, a thickness of the second barrier layer may be from about 500 Å to about 2000 Å, a thickness of the first buffer sub-layer may be from about 500 Å to about 1000 Å, and a thickness of the second buffer sub-layer may be from about 1000 Å to about 3000 Å.

A thickness of the adhesive layer may be equal to or less than about 100 Å.

According to embodiments of the present invention, when the barrier layer and the buffer layer are formed as described above, it is possible to provide a high-quality flexible display by minimizing failure of the element due to hydrogen.

Further, according to embodiments of the present invention, cracks due to stress of the thin film are not generated, so that it is possible to provide a flexible display in which a thin film separation phenomenon is minimized.

DETAILED DESCRIPTION OF CERTAIN INVENTIVE EMBODIMENTS

Figure 1:
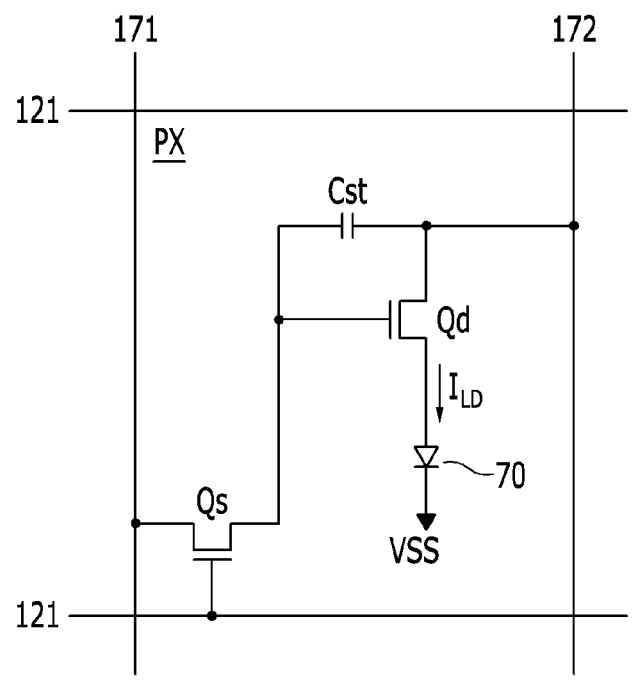
FIG. 1 is a circuit diagram illustrating a pixel circuit included in an organic light emitting diode display according to one embodiment.

In the following detailed description, only certain embodiments of the present invention have been shown and described, simply by way of illustration. As those skilled in the art would realize, the described embodiments may be modified in various ways, without departing from the spirit or scope of the present invention.

In describing the present disclosure, parts that are not related to the description will be omitted. Like reference numerals generally designate like elements throughout the specification.

In addition, the size and thickness of each element shown in the drawings are arbitrarily shown for better understanding and ease of description, but embodiments of the present invention are not limited thereto.

In the drawings, the thickness of layers, films, panels, regions, etc., may be exaggerated for clarity, better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, the word "on" means positioning above or below the object portion, but does not essentially mean positioning on the upper side of the object portion based on a gravity direction.

Now, a flexible display according to an embodiment of the present invention and a manufacturing method thereof will be described in detail with reference to the drawings.

A flexible display according to an embodiment may be an organic light emitting diode display including an organic light emitting diode.

FIG. 1 is a circuit diagram illustrating a pixel circuit included in an organic light emitting diode display according to one embodiment The organic light emitting diode display includes a plurality of signal lines 121, 171, and 172, and pixels PX connected with the plurality of signal lines 121, 171, and 172.

The signal lines includes a gate line 121 for transferring a gate signal (or a scan signal), a data line 171 for transferring a data signal, and a driving voltage line 172 for transferring a driving voltage. The gate lines 121 extend approximately in a row direction and are almost parallel to each other, and the data lines 171 extend approximately in a column direction and are almost parallel to each other. The driving voltage lines 172 extending approximately in a column direction are illustrated, but they may extend in a row direction or a column direction or may be formed to have a mesh shape.

One pixel PX includes a switching transistor Qs, a driving transistor Qd, a storage capacitor Cst, and an organic light emitting element 70.

The switching transistor Qs has a control terminal, an input terminal, and an output terminal. The control terminal is connected to the gate line 121, the input terminal is connected to the data line 171, and the output terminal is connected to the driving transistor Qd. The switching transistor Qs responds to the scan signal received from the gate line 121 to transfer the data signal received from the data line 171 to the driving transistor Qd.

The driving transistor Qd also has a control terminal, an input terminal, and an output terminal. The control terminal is connected to the switching transistor Qs, the input terminal is connected to the driving voltage line 172, and the output terminal is connected to the organic light emitting element 70. The driving transistor Qd allows an output current ILD, having a magnitude which varies according to the voltage applied between the control terminal and the output terminal, to flow therethrough.

The capacitor Cst is connected between the control terminal and the input terminal of the driving transistor Qd. This capacitor Cst charges the data signal applied to the control terminal of the driving transistor Qd and maintains the data signal even after the switching transistor Qs is turned off.

An organic light emitting element 70 is, for example, an organic light emitting diode (OLED), and has an anode connected to the output terminal of the driving transistor Qd and a cathode connected to a common voltage Vss. The organic light emitting element 70 displays an image by emitting light while the intensity thereof is changed according to the output current ILD of the driving transistor Qd. The organic light emitting element 70 may include an organic material intrinsically emitting any one or at least one light of primary colors such as, for example, three primary colors of red, green, and blue, and the organic light emitting diode display displays a desired image by a spatial sum of the colors.

Hereinafter, the organic light emitting diode display according to an embodiment will be described in detail with reference to FIG. 2.

Figure 2:
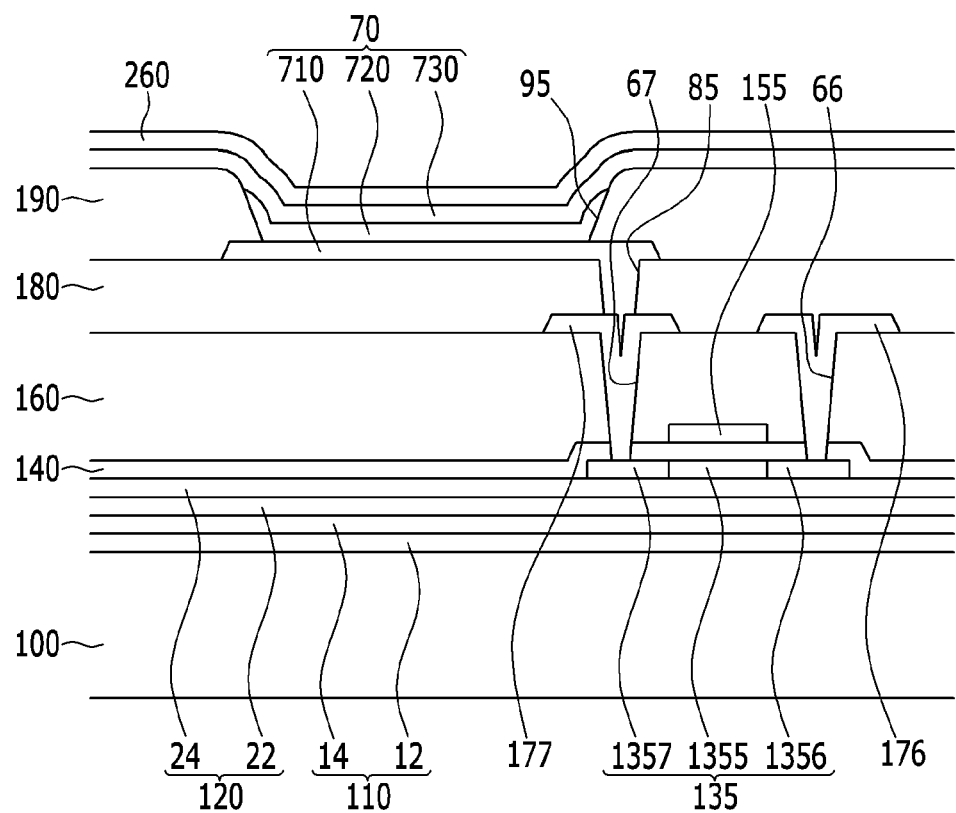
FIG. 2 is a cross-sectional view of one pixel of the organic light emitting diode display of FIG. 1.

FIG. 2 is a cross-sectional view of one pixel of the organic light emitting diode display of FIG. 1.

In reference to FIG. 2, one pixel will be described in detail according to a stack sequence based on the driving thin film transistor Qd and the organic light emitting element 70 of FIG. 1. Hereinafter, the driving thin film transistor Qd is referred to as a thin film transistor.

As illustrated in FIG. 2, a buffer layer 120 is formed on a substrate 100.

The substrate 100 may be made of an organic material which has an insulating property, and is flexible to be heat-treatable at a temperature equal to or higher than about 450° C., and may be formed in a single layer formed of, for example, a polyimide, or multiple layers formed by repeatedly stacking the polyimide through application and curing.

The substrate 100 may be formed to have a thickness of about 8 μm to about 12 μm, and because handling thereof is not easy due to the small thickness of the substrate, an auxiliary substrate (not illustrated) made of a material such as, for example, PET or PEN, may be attached thereto.

A barrier layer 110 is formed on the substrate 100. The barrier layer 110 blocks unnecessary components such as moisture or oxygen from entering the light emitting diode from the outside. The barrier layer 110 includes a first barrier sub-layer 12 formed of, for example, a silicon oxide and a second barrier sub-layer 14 formed of, for example, a silicon nitride. A thickness of the first barrier sub-layer may be about 1,000 Å to about 6,000 Å, and a thickness of the second barrier sub-layer may be about 500 Å to 2,000 Å.

The buffer layer 120 is formed on the barrier layer 110.

The buffer layer 120 includes a first buffer sub-layer 22 formed of, for example, a silicon nitride and a second buffer sub-layer 24 formed of, for example, a silicon oxide.

The second barrier sub-layer 14 and the first buffer sub-layer 22 may be formed of a silicon nitride having the same film quality, for example, the same density and the same thin film stress, and an oxide film may be positioned at an interface between the second barrier sub-layer 14 and the first buffer sub-layer 22. The oxide film may be a natural oxide film formed between processes of forming the second barrier sub-layer 14 and the first buffer sub-layer 22, and may have a thickness of several tens of Angstroms or less.

The buffer layer 120 serves to prevent unnecessary components such as impurities or moisture from permeating, and planarizes the surface. Further, the buffer layer 120 may prevent impurities which may be generated due to the barrier layer.

A thickness of the first buffer sub-layer may be about 500 Å to 1000 Å, and a thickness of the second buffer sub-layer may be about 1,000 Å to 3,000 Å.

A semiconductor 135 formed of polysilicon is formed on the buffer layer 120.

The semiconductor 135 is divided into a channel region 1355, and a source region 1356 and a drain region 1357 formed at both sides of the channel region 1355. The channel region 1355 of the semiconductor 135 is polysilicon not doped with the impurity, that is, an intrinsic semiconductor. The source region 1356 and the drain region 1357 are polysilicon doped with a conductive impurity, that is, an impurity semiconductor. The impurity doped on the source region 1356 and the drain region 1357 may be any one of a p-type impurity and an n-type impurity.

A gate insulating layer 140 is formed on the semiconductor 135. The gate insulating layer 140 may be a single layer or a plurality of layers including at least one of tetraethoxysilane (tetraethyl orthosilicate, TEOS), silicon nitride, and silicon oxide or the like.

A gate electrode 155 is formed on the semiconductor 135, and the gate electrode 155 overlaps the channel region 1355.

The gate electrode 155 may be formed in a single layer or a plurality of layers including a low resistance material such as, for example, Al, Ti, Mo, Cu, Ni, or an alloy thereof, or a material having a high anticorrosive property.

A first interlayer insulating film 160 is formed on the gate electrode 155. The first interlayer insulating film 160 may be formed in a single layer or a plurality of layers formed of, for example, tetraethoxysilane (tetraethyl orthosilicate, TEOS), silicon nitride, or silicon oxide.

The first interlayer insulating film 160 and the gate insulating layer 140 include a source contact hole 66 and a drain contact hole 67 through which the source region 1356 and the drain region 1357 are exposed, respectively.

A source electrode 176 and a drain electrode 177 are formed on the first interlayer insulating film 160. The source electrode 176 is connected with the source region 1356 through the source contact hole 66, and the drain electrode 177 is connected with the drain region 1357 through the drain contact hole 67.

The source electrode 176 and the drain electrode 177 may be formed in a single layer or a plurality of layers of a low resistance material such as, for example, Al, Ti, Mo, Cu, Ni, or an alloy thereof, or a material having a high anticorrosive property. For example, the source electrode 176 and the drain electrode 177 may be a triple layer of Ti/Cu/Ti, Ti/Ag/Ti, or Mo/Al/Mo, among others.

The gate electrode 155, the source electrode 176, and the drain electrode 177 are the control electrode, the input electrode, and the output electrode of FIG. 1, respectively, and form the thin film transistor together with the semiconductor 135. Channels of the thin film transistor are formed in the semiconductor 135 between the source electrode 176 and the drain electrode 177.

A second interlayer insulating layer 180 is formed on the source electrode 176 and the drain electrode 177. The second interlayer insulating layer 180 includes a via hole 85 through which the drain electrode 177 is exposed.

The second interlayer insulating layer 180 may be formed in a single layer or a plurality of layers formed of, for example, tetraethoxysilane (tetraethyl ortho silicate, TEOS), silicon nitride, or silicon oxide, and may be formed of an organic material with a low dielectric constant.

A first electrode 710 is formed on the second interlayer insulating layer 180. The first electrode 710 is electrically connected with the drain electrode 177 through the via hole 85, and may be an anode of the organic light emitting diode of FIG. 1.

A pixel defining layer 190 is formed on the first electrode 710.

The pixel defining layer 190 has an opening 95 through which the first electrode 710 is exposed. The pixel defining layer 190 may be formed to include a resin, such as, for example, a polyacrylate or a polyimide, silica-based inorganic materials, or the like.

An organic emission layer 720 is formed in the opening 95 of the pixel defining layer 190.

The organic emission layer 720 is formed of a plurality of layers including one or more of an emission layer, a hole injection layer (HIL), a hole transport layer (HTL), an electron transport layer (ETL), and an electron injection layer (EIL).

In the case where the organic emission layer 720 includes all of the above layers, the hole injection layer (HIL) may be positioned on the first electrode 710 that is the anode, and the hole transport layer (HTL), the emission layer, the electron transport layer (ETL), and the electron injection layer (EIL) may be sequentially laminated thereon.

A second electrode 730 is formed on the pixel defining layer 190 and the organic emission layer 720.

The second electrode 730 is a cathode of the organic light emitting diode. Accordingly, the first electrode 710, the organic emission layer 720, and the second electrode 730 form the organic light emitting element 70.

The organic light emitting diode display may have any one structure of a top display type, a bottom display type, and a dual display type according to a direction of light emitted by the organic light emitting element 70.

In the top display type, the first electrode 710 is formed as a reflective layer, and the second electrode 730 is formed as a semi-transmissive layer or a transmissive layer. On the other hand, in the case of the bottom display type, the first electrode 710 is formed as the semi-transmissive layer, and the second electrode 730 is formed as the reflective layer. In addition, in the case of the dual display type, the first electrode 710 and the second electrode 730 are formed as a transparent layer or the semi-transmissive layer.

The reflective layer and the semi-transmissive layer are made by using one or more metals of, for example, magnesium (Mg), silver (Ag), gold (Au), calcium (Ca), lithium (Li), chromium (Cr), and aluminum (Al), or an alloy thereof. The reflective layer and the semi-transmissive layer are determined by thickness, and as the thickness thereof becomes smaller, transmittance is increased, so the semi-transmissive layer may be formed to have a thickness of about 200 nm or less.

The transparent layer is formed of a material such as, for example, indium tin oxide (ITO), indium zinc oxide (IZO), zinc oxide (ZnO), or indium oxide ($In_2O_3$).

An encapsulation layer 260 is formed on the second electrode 730.

The encapsulation layer 260 may be formed by alternately laminating one or more organic layers and one or more inorganic layers.

The inorganic layer or the organic layer may be each provided in plural.

The organic layer is formed of a polymer, and may be a single layer or a laminated layer formed of any one of, for example, polyethylene terephthalate, a polyimide, a polycarbonate, an epoxy, a polyethylene, and a polyacrylate. The organic layer may be formed of a polyacrylate, and particularly, includes a matter obtained by polymerizing a monomer composition including a diacrylate-based monomer and a triacrylate-based monomer. A monoacrylate-based monomer may be further included in the monomer composition. Further, a publicly known photoinitiator such as TPO may be further included in the monomer composition, but the monomer composition is not limited thereto.

The inorganic layer may be a single layer or a laminated layer including a metal oxide or a metal nitride. For example, the inorganic layer may include any one of $SiN_x$, $Al_2O_3$, $SiO_2$, and $TiO_2$.

The uppermost layer of the encapsulation layer, which is exposed to the outside, may be formed of the inorganic layer in order to prevent moisture transmission to the organic light emitting diode.

The encapsulation layer may include at least one sandwich structure in which at least one organic layer is inserted between at least two inorganic layers. Further, the encapsulation layer may include at least one sandwich structure in which at least one inorganic layer is inserted between at least two organic layers.

The encapsulation layer may sequentially include a first inorganic layer, a first organic layer, and a second inorganic layer on the display unit. Further, the encapsulation layer may sequentially include a first inorganic layer, a first organic layer, a second inorganic layer, a second organic layer, and a third inorganic layer on the display unit. Further, the encapsulation layer may sequentially include a first inorganic layer, a first organic layer, a second inorganic layer, a second organic layer, a third inorganic layer, a third organic layer, and a fourth inorganic layer on the display unit.

A halogenated metal layer including, for example, LiF, may be further included between the display unit and the first inorganic layer. The halogenated metal layer may prevent the display unit from being damaged when the first inorganic layer is formed by a sputtering method or a plasma deposition method.

The first organic layer has a smaller area than that of the second inorganic layer, and the second organic layer has a smaller area than that of the third inorganic layer. Further, the first organic layer is completely covered by the second inorganic layer, and the second organic layer is completely covered by the third inorganic layer.

Now, a manufacturing method of the organic light emitting diode display will be described in detail with reference to FIGS. 3 to 7 together with the aforementioned FIG. 2.

FIGS. 3 to 7 are cross-sectional views illustrating a manufacturing method of the organic light emitting diode display according to an embodiment.

Figure 3:
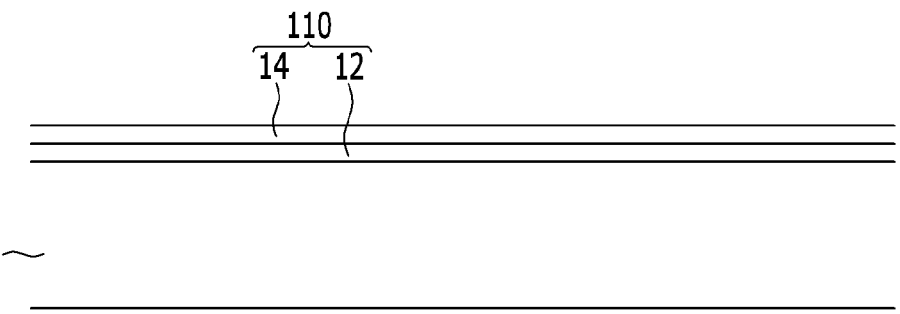
FIGS. 3 to 7 are cross-sectional views illustrating a manufacturing method of the organic light emitting diode display according to an embodiment.

First, as illustrated in FIG. 3, the barrier layer 110 is formed on the substrate 100.

The substrate 100 may be a flexible substrate formed by applying a polymer material, such as, for example, a polyimide, on a supporting substrate (not illustrated) and curing the polymer material. In this case, the substrate may be formed as multiple layers by repeatedly applying and curing the polymer material. The support substrate may be formed of glass, metal, or ceramic, and polyimide may be applied by an application process such as spin coating, slit coating, inkjet coating, or the like, on the supporting substrate.

In the barrier layer 110, the first barrier sub-layer 12 is formed by depositing a silicon oxide, and subsequently, the second barrier sub-layer 14 is formed by depositing a silicon nitride by an in-situ process.

In this case, the first barrier sub-layer 12 may be formed of SiOx or SiON, and the first barrier sub-layer 12 may be formed to have a thickness of about 1000 Å to about 6000 Å.

Further, the second barrier sub-layer 14 may be formed of SiNx or SiON, and the second barrier sub-layer 14 may be formed to have a thickness of about 500 Å to about 2000 Å.

Figure 4:
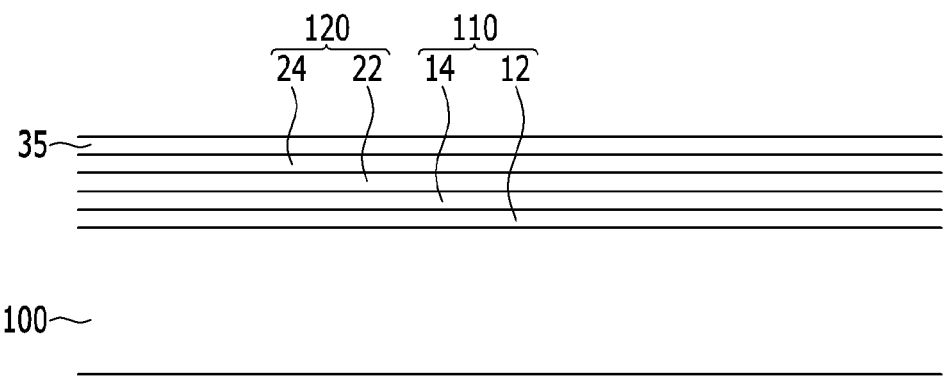

Next, as illustrated in FIG. 4, the buffer layer 120 is formed on the second barrier sub-layer 14.

The buffer layer 120 includes the first buffer sub-layer 22 and the second buffer sub-layer 24.

In this case, after the second barrier sub-layer 14 is formed, stress of the second barrier sub-layer 14 is released by exposing the second barrier sub-layer 14 to the air, and then the first buffer sub-layer 22 is formed.

The second barrier sub-layer 14 and the first buffer sub-layer 22 may be formed of the same material to be continuously formed in one thin film, but, after the second barrier sub-layer 14 is formed, the stress of the second barrier sub-layer 14 is released and then the first buffer sub-layer 22 is formed, so that it is possible to decrease cracks due to the barrier layer 110 and the buffer layer 120.

That is, as a thickness of the thin film becomes larger, stress of the thin film is increased, and, when the stress of the second buffer sub-layer 14 is released by exposing the second barrier sub-layer 14 to the air after the second barrier sub-layer 14 is formed, and the first buffer sub-layer 22 is formed of the same material as that of the second barrier sub-layer 14 again, it is possible to decrease stress compared to stress in a case where a thick thin film is formed at once. Accordingly, the cracks of the thin film due to the stress of the thin film are decreased, so that it is possible to prevent a semiconductor and the like from being damaged and the thin film from being separated.

The first buffer sub-layer 22 is formed of SiNx or SiON on the second barrier sub-layer 14, and is formed to have the same stress of the thin film as that of the second barrier sub-layer 14. In this case, the first buffer sub-layer 22 is formed at a temperature equal to or higher than the temperature at which the first barrier sub-layer 12 is formed, and may be formed to have a thickness of about 500 Å to about 1000 Å.

Further, the second buffer sub-layer 24 may be formed on the first buffer sub-layer 24 by the in-situ process, and may be formed of $SiO_2$ or SiON. In this case, the second buffer sub-layer 24 may be formed to have a thickness of about 1000 Å to about 3000 Å.

An amorphous silicon film 35 is formed on the buffer layer 120, and a dehydrogenation process is performed. The dehydrogenation process may be performed for about 5 minutes to about 1 hour at about 450° C. to about 470° C.

The dehydrogenation process is performed in order to remove hydrogen within the amorphous silicon film. In this case, hydrogen contained in the second barrier sub-layer 14 and the first buffer sub-layer 22 may also be partially removed.

Figure 5:
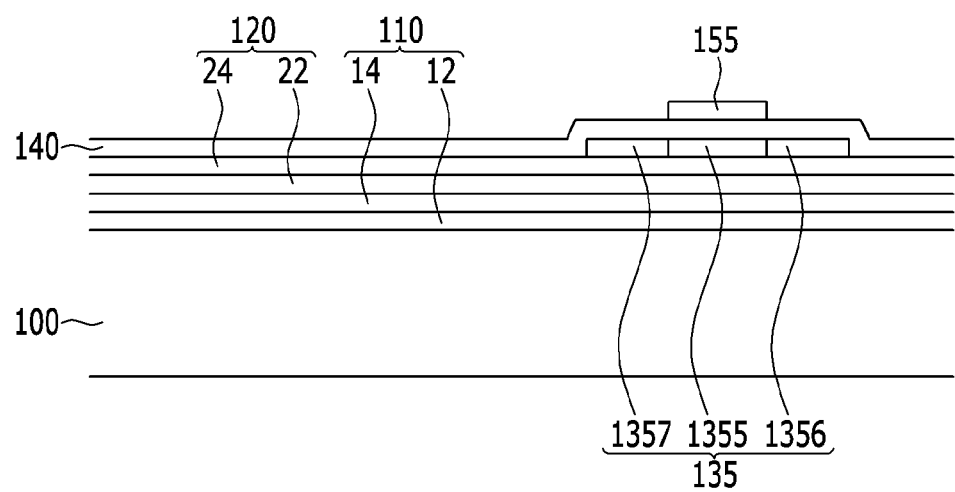

Next, as illustrated in FIG. 5, the semiconductor 135 is formed by crystallizing and then patterning the amorphous silicon layer.

Then, the gate insulating film 140 is formed of a silicon oxide or silicon nitride on the semiconductor 135, and a metal film is formed on the gate insulating film 140 and is then patterned to form the gate electrode 155.

Next, the source region 1356 and the drain region 1357 are formed by doping conductive impurity ions on the semiconductor 135 at a high concentration by using the gate electrode 155 as a mask. A space between the source region 1356 and the drain region 1357 becomes the channel region 1355.

Then, an activation process is performed in order to activate the conductive impurity ions.

The activation process may be performed for about 5 minutes to about 2 hours at about 450° C. to about 470° C., or may be performed within about 2 minutes at a temperature of about 500° C. or higher by rapid thermal annealing (RTA). In this case, the impurity ions may be activated, and the hydrogen contained in the second barrier sub-layer 14 and the first buffer sub-layer 22 may also be partially removed.

Figure 6:
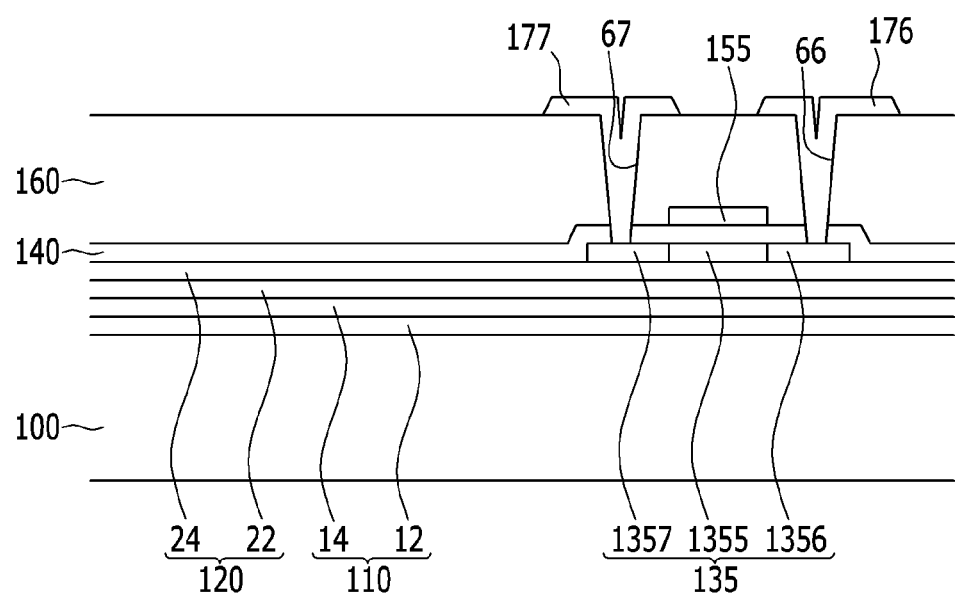

Next, as illustrated in FIG. 6, the first interlayer insulating film 160 is formed on the gate electrode 155.

Then, the contact holes 66 and 67, through which the semiconductor 135 is exposed, are formed by etching the first interlayer insulating film 160 and the gate insulating film 140.

A heat treatment process is then performed. The purpose of the heat treatment is to cure the interlayer insulating film and the surface of the semiconductor that are damaged due to plasma during the etching process for forming the contact holes. A hydrogen passivation process may be performed for about 30 minutes to about 60 minutes at a temperature of about 330° C. to about 380° C.

The source electrode 176 and the drain electrode 177, which are connected to the source region 1356 and the drain region 1357 through the contact holes 66 and 67, respectively, are formed by forming a metal film on the first interlayer insulating film 160 and then patterning the metal film.

Figure 7:
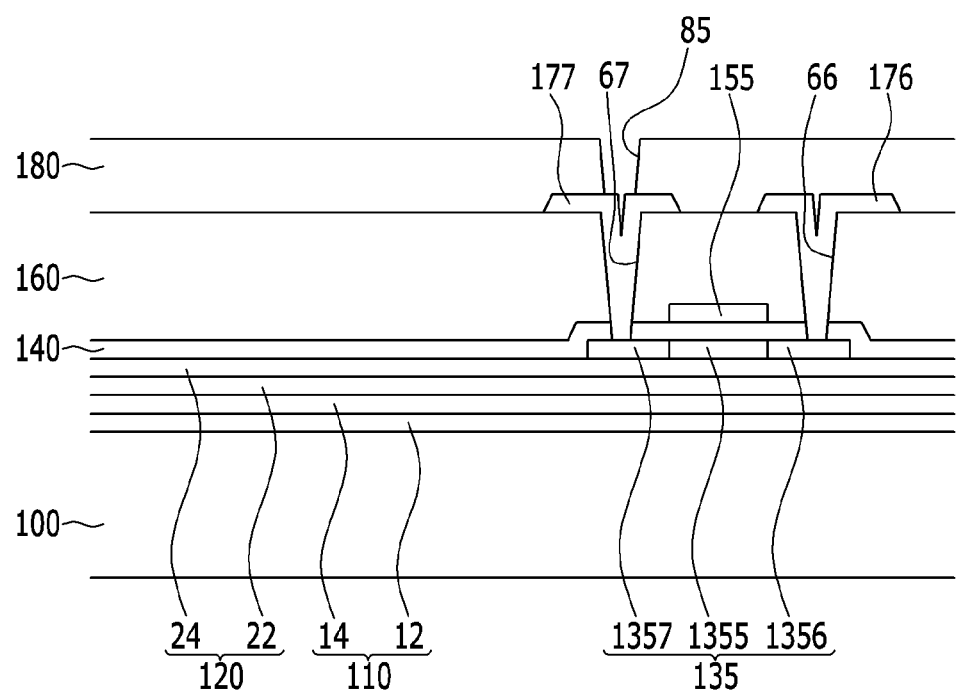

As illustrated in FIG. 7, a second interlayer insulating film 180 is then formed on the source electrode 176 and the drain electrode 177.

Then, the contact hole 85, through which the drain electrode 177 is exposed, is formed by etching the second interlayer insulating film 180.

Subsequently, as illustrated in FIG. 2, the first electrode 710 is formed by forming a metal film on the second interlayer insulating film 180 and patterning the metal film.

Further, the pixel defining film 190 having the opening 95 is formed on the first electrode 710, the organic emission layer 720 is formed within the opening 95 of the pixel defining film 190, and the second electrode 730 is formed on the organic emission layer 720.

Then, an encapsulation layer is formed on the second electrode and the supporting substrate (not illustrated) is removed, thereby completing the organic light emitting diode display.

Figure 8:
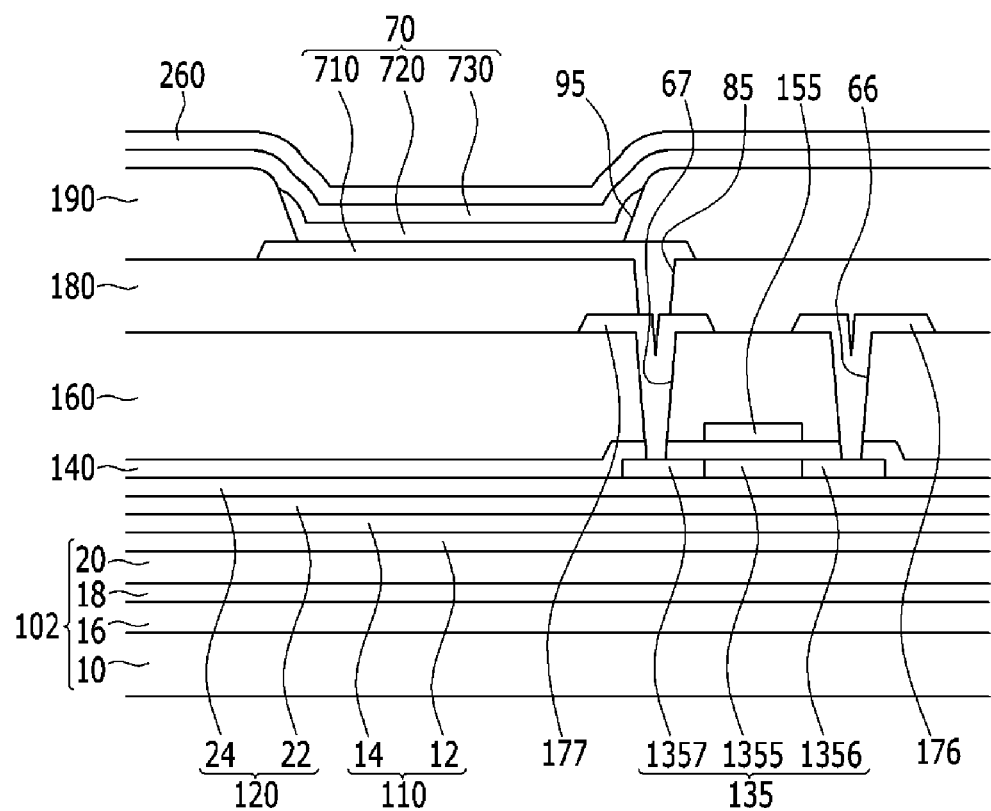
FIG. 8 is a cross-sectional view illustrating an organic light emitting diode display according to another embodiment.

FIG. 8 is a cross-sectional view of an organic light emitting diode display according to another embodiment.

Most of the interlayer configurations of the organic light emitting diode display of FIG. 8 are the same as those of the organic light emitting diode display of FIG. 2, so only the different parts will be described in detail.

A substrate 102 of the organic light emitting diode display of FIG. 8 includes a first flexible substrate 10, an intermediate barrier layer 16, an adhesive layer 18, and a second flexible substrate 20.

The first flexible substrate 10 and the second flexible substrate 20 may be formed of the same material, such as, for example, a polyimide, the intermediate barrier layer 16 may be formed of an inorganic material including at least one of, for example, SiOx and SiNx, and the adhesive layer 18 may be formed of hydrogenated amorphous silicon (a-Si:H).

A main constituent of a polymer material forming the flexible substrate includes hydrogen having an excellent bonding force with carbon (C) and silicon of the intermediate barrier layer, so the amorphous silicon may be used as an adhesive material for strongly bonding the flexible substrate and the intermediate barrier layer.

The first flexible substrate 10 and the second flexible substrate 20 may further include an auxiliary substrate (not illustrated), such as for example polyethylene terephthalate (PET) and polyethylene naphthalate (PEN), for easy handling during the process of manufacturing the organic light emitting diode display.

In the substrate 102, the first flexible substrate 10 is formed by applying a polymer material on a supporting substrate (not illustrated) and then curing the polymer material. The support substrate may be formed of glass, metal, or ceramic, and the polyimide may be applied by an application process such as spin coating, slit coating, and inkjet coating on the supporting substrate.

Further, the intermediate barrier layer 16 is formed by depositing silicon oxide on the first flexible substrate 10. The intermediate barrier layer 16 may be formed to have a thickness of about 1000 Å to about 6000 Å.

The adhesive layer 18 is then formed by depositing amorphous silicon, in which a P-type or N-type semiconductor material is doped, on the intermediate barrier layer 16, or hydrogenated amorphous silicon. The adhesive layer 18 is formed to have a thickness equal to or less than about 100 Å, and improves bonding force between the first flexible substrate 10 and the second flexible substrate 20.

The second flexible substrate 20 is formed by applying the same material as that of the first flexible substrate 10 and curing the material. The second flexible substrate 20 may be formed of, for example, a polyimide, and the second flexible substrate 20 is formed by the same method as that of the first flexible substrate 10.

Each of the first flexible substrate 10 and the second flexible substrate 20 may be formed to have a thickness of about 8 μm to about 12 μm.

As illustrated in FIG. 8, when the substrate 102 is formed of the first flexible substrate 10 and the second flexible substrate 20, pin holes, cracks, and the like formed during the manufacturing of the first flexible substrate 10 are covered by the second flexible substrate 20, so that it is possible to remove the aforementioned defect.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A flexible display, comprising (i) through (viii) in order:
   (i) a first flexible substrate;
   (ii) an intermediate barrier layer positioned on the first flexible substrate and comprising silicon oxide;
   (iii) an adhesive layer positioned on the intermediate barrier layer and comprising at least one of amorphous silicon on which a P-type or N-type conductive impurity is doped, or hydrogenated amorphous silicon;
   (iv) a second flexible substrate positioned on the adhesive layer;
   (v) a first barrier layer positioned on the second flexible substrate and comprising silicon oxide;
   (vi) a second barrier layer positioned on the first barrier layer and comprising silicon nitride;
   (vii) a buffer layer positioned on the second barrier layer and comprising silicon oxide; and
   (viii) a thin film transistor positioned on the buffer layer; and
   further comprising an organic light emitting element connected to the thin film transistor.

2. The flexible display of claim 1, wherein the first flexible substrate and the second flexible substrate comprise polyimide.

3. The flexible display of claim 2, wherein each of the first flexible substrate and the second flexible substrate is formed to have a thickness of about 8 μm to about 12 μm.

4. The flexible display of claim 2, wherein a thickness of the intermediate barrier layer is from about 1000 Å to about 6000 Å.

5. The flexible display of claim 1, wherein the buffer layer comprises a first buffer sub-layer positioned on the second barrier layer and a second buffer sub-layer positioned on the first buffer sub-layer, and the first buffer sub-layer comprises silicon nitride.

6. The flexible display of claim 5, wherein: a thickness of the first barrier layer is between about 1000 Å and about 6000 Å.

7. The flexible display of claim 5, wherein: a thickness of the second barrier layer is between about 500 Å and about 2000 Å.

8. The flexible display of claim 5, wherein: a thickness of the first buffer sub-layer is between about 500 Å and about 1000 Å.

9. The flexible display of claim 5, wherein: a thickness of the second buffer sub-layer is between about 1000 Å and about 3000 Å.

10. The flexible display of claim 1, wherein a thickness of the adhesive layer is equal to or less than about 100 Å.

* * * * *